United States Patent
Shimada et al.

(10) Patent No.: US 9,587,208 B2
(45) Date of Patent: Mar. 7, 2017

(54) CLEANING LIQUID COMPOSITION, METHOD FOR CLEANING SEMICONDUCTOR ELEMENT, AND METHOD FOR MANUFACTURING SEMICONDUCTOR ELEMENT

(71) Applicant: MITSUBISHI GAS CHEMICAL COMPANY, INC., Chiyoda-ku (JP)

(72) Inventors: Kenji Shimada, Tokyo (JP); Kojiro Abe, Tokyo (JP); Hiroshi Yoshida, Tokyo (JP); Masaru Ohto, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 14/406,620

(22) PCT Filed: Jun. 6, 2013

(86) PCT No.: PCT/JP2013/065738
§ 371 (c)(1),
(2) Date: Dec. 9, 2014

(87) PCT Pub. No.: WO2013/187313
PCT Pub. Date: Dec. 19, 2013

(65) Prior Publication Data
US 2015/0152366 A1    Jun. 4, 2015

(30) Foreign Application Priority Data

Jun. 13, 2012 (JP) .................................. 2012-134037

(51) Int. Cl.
*C09K 13/00* (2006.01)
*C11D 11/00* (2006.01)
(Continued)

(52) U.S. Cl.
CPC .......... *C11D 11/0047* (2013.01); *C11D 3/044* (2013.01); *C11D 3/28* (2013.01);
(Continued)

(58) Field of Classification Search
CPC ... C09K 13/02; C09K 13/06; H01L 21/02063; H01L 21/31133; H01L 21/31111; H01L 21/76838
(Continued)

(56) References Cited

U.S. PATENT DOCUMENTS 8,206,509 B2     6/2012  Eto et al.
2004/0259761 A1  12/2004 Yokoi et al.
(Continued)

FOREIGN PATENT DOCUMENTS

JP   2000-345400   12/2000
JP   3124512       1/2001
(Continued)

OTHER PUBLICATIONS

Wikipedia, The Free Encyclopedia, Azole, via https://web.archive.org/web/20120212082352/http://en.wikipedia.org/wiki/Azole ; 3 pages; 2011.*

(Continued)

*Primary Examiner* — Binh X Tran
(74) *Attorney, Agent, or Firm* — Oblon, McClelland, Maier & Neustadt, L.L.P.

(57) ABSTRACT

The object is to provide a cleaning liquid composition, which suppresses damage to a low-dielectric constant interlayer dielectric film, a wiring material, such as copper or a copper alloy, a barrier metal, and a barrier dielectric film and removes an organosiloxane thin film, a dry etching residue and a photoresist on a treatment target surface in a process for producing a semiconductor device, as well as a cleaning method for a semiconductor device using the same, and a (Continued)

production process for a semiconductor device using the same. A cleaning liquid composition for producing a semiconductor device according to the invention contains 0.05 to 25% by weight of a quaternary ammonium hydroxide, 0.001 to 1.0% by weight of potassium hydroxide, 5 to 85% by weight of a water-soluble organic solvent, and 0.0005 to 10% by weight of pyrazoles.

6 Claims, 2 Drawing Sheets

(51) Int. Cl.
| | |
|---|---|
| *H01L 21/02* | (2006.01) |
| *H01L 21/311* | (2006.01) |
| *H01L 21/768* | (2006.01) |
| *C11D 7/06* | (2006.01) |
| *C11D 7/32* | (2006.01) |
| *G03F 7/42* | (2006.01) |
| *C11D 3/04* | (2006.01) |
| *C11D 3/28* | (2006.01) |
| *C11D 3/30* | (2006.01) |
| *C11D 3/43* | (2006.01) |
| *H01L 21/308* | (2006.01) |

(52) U.S. Cl.
CPC .................. *C11D 3/30* (2013.01); *C11D 3/43* (2013.01); *C11D 7/06* (2013.01); *C11D 7/3209* (2013.01); *C11D 7/3281* (2013.01); *G03F 7/425* (2013.01); *H01L 21/02063* (2013.01); *H01L 21/02071* (2013.01); *H01L 21/308* (2013.01); *H01L 21/31111* (2013.01); *H01L 21/31133* (2013.01); *H01L 21/76814* (2013.01); *H01L 21/76838* (2013.01)

(58) Field of Classification Search
USPC ............. 252/79.1, 79.4, 79.5; 438/750, 754; 216/95, 96, 105
See application file for complete search history.

(56) References Cited

U.S. PATENT DOCUMENTS

| | | |
|---|---|---|
| 2007/0099810 A1 | 5/2007 | Matsunaga et al. |
| 2009/0082240 A1 | 3/2009 | Nukui et al. |
| 2009/0084406 A1 | 4/2009 | Lee et al. |
| 2010/0056410 A1* | 3/2010 | Visintin et al. ............... 510/176 |
| 2010/0160200 A1 | 6/2010 | Seki et al. |
| 2011/0129998 A1 | 6/2011 | Eto et al. |
| 2012/0045898 A1* | 2/2012 | Uozumi ........................ 438/686 |
| 2012/0231396 A1* | 9/2012 | Andou et al. ................. 430/319 |
| 2013/0296214 A1* | 11/2013 | Barnes et al. ............... 510/176 |
| 2014/0051804 A1* | 2/2014 | Zhou et al. .................. 524/769 |

FOREIGN PATENT DOCUMENTS

| | | |
|---|---|---|
| JP | 2002-062668 | 2/2002 |
| JP | 2003-140364 | 5/2003 |
| JP | 2006-083376 | 3/2006 |
| JP | 2006-527783 | 12/2006 |
| JP | 2007-119783 | 5/2007 |
| JP | 2007-214290 | 8/2007 |
| JP | 2009-075285 | 4/2009 |
| JP | 2009-111409 | 5/2009 |
| JP | 4267359 | 5/2009 |
| JP | 2009-231354 | 10/2009 |
| JP | 2009-260249 | 11/2009 |
| JP | 2011-118101 | 6/2011 |

OTHER PUBLICATIONS

International Search Report Issued Aug. 20, 2013 in PCT/JP13/065738 Filed Jun. 6, 2013.
European Search Report issued Feb. 2, 2016, in Application No. 13804977.0 filed Jun. 6, 2013.

* cited by examiner

CLEANING LIQUID COMPOSITION, METHOD FOR CLEANING SEMICONDUCTOR ELEMENT, AND METHOD FOR MANUFACTURING SEMICONDUCTOR ELEMENT

TECHNICAL FIELD

The present invention relates to a cleaning liquid composition, a cleaning method for a semiconductor device, and a production process for a semiconductor device, more precisely to a cleaning liquid composition, which suppresses damage to a low-dielectric constant interlayer dielectric film, a wiring material, such as copper or a copper alloy, a hard mask, a barrier metal, a barrier dielectric film, and a hard mask, and removes an organosiloxane thin film, a dry etching residue, and a photoresist on a treatment target surface in a process for producing a semiconductor device, as well as a cleaning method for a semiconductor device using the same, and a production process for a semiconductor device using the same.

BACKGROUND ART

For producing a highly integrated semiconductor device, the following steps are generally performed. Namely, on an element such as a silicon wafer, an electro-conductive film such as a metal film to become a wiring material for electrical conduction, and an interlayer dielectric film for the sake of insulation between electro-conductive films are formed, and then on a surface thereof a photoresist is coated homogeneously to form a photosensitive layer, which is then subjected to selectively exposure and development treatments to form a desired resist pattern. Then using the resist pattern as a mask an interlayer dielectric film is subjected to a dry etching treatment to form a desired pattern in the film. Thereafter, the resist pattern and a residue generated by a dry etching treatment (hereinafter referred to as "dry etching residue") are completely removed by oxygen plasma ashing or with a cleaning liquid.

As the result of advances in shrinkage in a design rule in recent years, RC delay is becoming a determining factor of the limit of high speed arithmetic processing. Consequently, an electro-conductive wiring material is shifting from aluminum to copper, which has lower electrical resistance, and because of this an interlayer dielectric film is shifting from a silicon oxide film to a low-dielectric constant film (a film with a relative dielectric constant of 3 or less, hereinafter referred to as "low-k film"). Further, for preventing copper from diffusing into an interlayer dielectric film, the copper is covered with a metal (hereinafter referred to as "barrier metal"), such as tantalum, and tantalum nitride, and a dielectric film (hereinafter referred to as "barrier dielectric film"), such as silicon nitride, and silicon carbide. Moreover, between a photoresist and an interlayer dielectric film, a film, which has a planarization function by filling a gap, such as ruggedness and a groove in a front end device, an absorption function of radiation reflected from a device, and a maintenance function of the shape of an interlayer dielectric film during dry etching for facilitating high precision microfabrication, has come to use. As such a film, there is, for example, an organosiloxane thin film containing a light absorption compound (hereinafter referred to as "organosiloxane thin film"). In the case of a pattern of 0.2 μm or less, for a resist with a film thickness of 1 μm, the aspect ratio of the pattern (ratio of resist film thickness divided by resist line width) becomes too high, and there arises a drawback that the pattern may collapse. To overcome the drawback, a hard mask method may be applied, by which a Ti-based or Si-based film (hereinafter referred to as "hard mask") may be inserted between a resist film and a pattern film to be formed actually so that a resist pattern is once transcribed to the hard mask by dry etching, and then the pattern is transcribed again to the film to be formed actually by dry etching using the hard mask as an etching mask. By the method, a gas for etching a hard mask and a gas for etching a film to be formed actually may be different, therefore for etching a hard mask a gas which can exhibit high selectivity with respect to a resist, and for etching an actual film a gas which can exhibit high selectivity with respect to a hard mask can be selected, and there is an advantage that a pattern can be formed with a thin resist. Further, tungsten is used for a contact plug which establishes a connection with a substrate.

However, when an organosiloxane thin film or a photoresist is removed by an oxygen plasma, there is a risk that a low-k film existing under an organosiloxane thin film may be damaged due to exposure to an oxygen plasma, etc. For example, in the case of patterning by a via first dual damascene process, there occurs a problem that a low-k film near a via is damaged and as the result the electrical property is extremely deteriorated, when an organosiloxane thin film filled in a via is removed by an oxygen plasma. Meanwhile, since a dry etching residue is stuck to a wafer in a removal step for an organosiloxane thin film, a dry etching residue must be removed at the same time with removal of an organosiloxane thin film or a photoresist. Therefore, for production of a semiconductor device using a low-k film, a method by which an organosiloxane thin film and a photoresist are removed to the same extent as by an oxygen plasma process, and at the same time a dry etching residue can be removed, while damages to a low-k film, copper, a barrier metal, and a barrier dielectric film are suppressed, has been demanded. Further, in some cases where the method is applied to a layer with an exposed contact plug, suppression of damage to tungsten is also required. Similarly, in a case where a hard mask is used, damage to a hard mask must be also suppressed.

In Patent Literature 1, a wiring forming method with a stripping/cleaning liquid containing a quaternary ammonium hydroxide, a water-soluble organic solvent, water, an anticorrosive, and potassium hydroxide is proposed.

In Patent Literature 2, a wiring forming method with a stripping/cleaning liquid containing a quaternary ammonium hydroxide, a water-soluble organic solvent, water, an anticorrosive, potassium hydroxide, and a specific imidazole derivative, which is a cleaning liquid superior in a corrosion suppression function on tungsten, is proposed.

In Patent Literature 3, a photoresist stripping method of a printed wiring board with a stripping liquid composed of an aqueous solution containing a quaternary ammonium hydroxide, a water-soluble amine, and a hydroxyamine and azoles anticorrosive, is proposed. As an example of azoles, pyrazole is presented. In Patent Literature 3, it is described that not only pyrazole but also 1-methyl-1H-benzotriazole is effective for corrosion protection of copper.

In Patent Literature 4, a resist stripping liquid containing a water-soluble amine and/or ammonium hydroxide, an oxidation agent, and water, and usable for a copper wiring is proposed, and as an example of a corrosion prevention agent for copper, etc. pyrazole is presented. In Patent Literature 4, it is further described that not only pyrazole but also a combination of benzotriazole, or tolyltriazole with ethanol is effective for corrosion protection of copper.

In Patent Literature 5, a resist stripping liquid containing an amine, a solvent, a strong alkali, and water, and usable for a copper wiring is proposed, and as an amine pyrazole is presented. In Patent Literature 5, it is further described that not only pyrazole but also ethanol amine is effective for corrosion protection of copper.

In Patent Literature 6, an etching solution for an etching resist for a copper-clad laminate containing nitric acid, a chlorate, an iron ion, and a copper inhibitor is proposed, and as an anticorrosive for copper pyrazole is presented. In Patent Literature 6, it is further described that not only pyrazole but also benzotriazole is effective for corrosion protection of copper.

In Patent Literature 7 and Patent Literature 8, a cleaning liquid which removes an etching residue of a semiconductor device provided with a copper wiring, and is composed of an aqueous solution containing nitric acid, sulfuric acid, a fluorine compound, and a basic compound is proposed, and as the basic compound pyrazole is presented.

In Patent Literature 9, an electrolytic stripping agent for silver containing an oxyacid having a carboxyl group and one or more hydroxy groups in a molecule, or a salt thereof as a main component is proposed, and as a discoloration prevention agent for copper, which is a treatment target, pyrazoles are presented. In Patent Literature 9, it is further described that not only pyrazole but also benzotriazole is effective for corrosion protection of copper.

CITATION LIST

Patent Literature

[Patent Literature 1] Japanese National Publication of International Patent Application No. 2006-527783
[Patent Literature 2] Japanese Unexamined Patent Application Publication No. 2011-118101
[Patent Literature 3] Japanese Unexamined Patent Application Publication No. 2002-62668
[Patent Literature 4] Japanese Patent No. 4267359
[Patent Literature 5] Japanese Unexamined Patent Application Publication No. 2003-140364
[Patent Literature 6] Japanese Patent No. 3124512
[Patent Literature 7] Japanese Unexamined Patent Application Publication No. 2006-83376
[Patent Literature 8] Japanese Unexamined Patent Application Publication No. 2009-111409
[Patent Literature 9] Japanese Unexamined Patent Application Publication No. 2000-345400

SUMMARY OF INVENTION

Technical Problem

However, the inventors have newly identified in the inventions described in Patent Literature 1 to 9 the following technical problems to be solved.

The cleaning liquid described in Patent Literature 1 cannot suppress adequately damage to copper, and therefore is not eligible for the present object.

The cleaning liquid described in Patent Literature 2 cannot suppress adequately damage to copper, and therefore is not eligible for the present object.

The cleaning liquid described in Patent Literature 3 cannot adequately remove an organosiloxane thin film, and causes significant damage to copper, and therefore is not eligible for the present object. Further, 1-methyl-1H-benzotriazole has no effect as an anticorrosive for copper to be combined with a cleaning liquid of the present invention containing a quaternary ammonium hydroxide, potassium hydroxide, a water-soluble organic solvent, and water.

The cleaning liquid described in Patent Literature 4 cannot remove adequately an organosiloxane thin film and a dry etching residue, and causes significant damage to copper, and therefore is not eligible for the present object. Further, a combination of benzotriazole, tolyltriazole, and ethanol has no effect as an anticorrosive for copper to be combined with a cleaning liquid of the present invention containing a quaternary ammonium hydroxide, potassium hydroxide, a water-soluble organic solvent, and water.

The cleaning liquid described in Patent Literature 5 cannot remove adequately an organosiloxane thin film, and causes significant damage to copper, and therefore is not eligible for the present object. Further, ethanolamine has no effect as an anticorrosive for copper to be combined with a cleaning liquid of the present invention containing a quaternary ammonium hydroxide, potassium hydroxide, a water-soluble organic solvent, and water.

The cleaning liquid described in Patent Literature 6 cannot remove adequately an organosiloxane thin film and a photoresist, and causes significant damage to copper, and therefore is not eligible for the present object. Further, benzotriazole has no effect as an anticorrosive for copper to be combined with a cleaning liquid of the present invention containing a quaternary ammonium hydroxide, potassium hydroxide, a water-soluble organic solvent, and water.

The cleaning liquids described in Patent Literature 7 and Patent Literature 8 cannot remove adequately an organosiloxane thin film and a photoresist, and causes significant damage to copper, and therefore are not eligible for the present object.

The cleaning liquid described in Patent Literature 9 cannot remove adequately an organosiloxane thin film, a dry etching residue, and a photoresist, and therefore is not eligible for the present object. Further, benzotriazole has no effect as an anticorrosive for copper to be combined with a cleaning liquid of the present invention containing a quaternary ammonium hydroxide, potassium hydroxide, a water-soluble organic solvent, and water.

An object of the present invention is to provide a cleaning liquid and a cleaning method, which suppresses damage to a low-k film, a wiring material, such as copper or a copper alloy, a hard mask, a barrier metal, a barrier dielectric film, and a hard mask, and removes an organosiloxane thin film, a dry etching residue and a photoresist on a treatment target surface in a process for producing a semiconductor device.

Solution to Problem

The present invention provides a method to achieve the object. The present invention is as follows.
1) A cleaning liquid composition for producing a semiconductor device comprising:
  0.05 to 25% by weight of a quaternary ammonium hydroxide,
  0.001 to 1.0% by weight of potassium hydroxide,
  5 to 85% by weight of a water-soluble organic solvent, and
  0.0005 to 10% by weight of pyrazoles.
2) The cleaning liquid composition according to 1) above, wherein the quaternary ammonium hydroxide is one or more kinds selected from the group consisting of tetramethylammonium hydroxide, tetraethylammonium hydroxide, tetrapropylammonium hydroxide, tetrabutylammonium hydroxide, and choline.

3) The cleaning liquid composition according to 1) or 2) above, wherein the water-soluble organic solvent is one or more kinds selected from the group consisting of alcohols selected from ethanol, 2-propanol, ethylene glycol, propylene glycol, glycerine, diethylene glycol, xylitol, and sorbitol; glycol ethers selected from diethylene glycol monomethyl ether, diethylene glycol monoethyl ether, diethylene glycol monobutyl ether, diethylene glycol dimethyl ether, dipropylene glycol monomethyl ether, and dipropylene glycol monopropyl ether; amides selected from N,N-dimethyl formamide, N,N-dimethyl acetamide, and N-methyl-2-pyrrolidone; dimethyl sulfoxide; and 1,3-dimethyl-2-imidazolidinone.

4) The cleaning liquid composition according to any of 1) to 3) above, wherein the pyrazole is one or more kinds selected from the group consisting of pyrazole, 3,5-dimethylpyrazole, 3-methyl-5-pyrazolone, and 3-amino-5-hydroxypyrazole.

5) The cleaning liquid composition according to any of 1) to 4) above, further comprising water.

6) The cleaning liquid composition according to any of 1) to 5) above not comprising azoles other than the pyrazoles.

7) A cleaning method for a semiconductor device comprising:
  layering in the order from bottom to top an organosiloxane thin film, and a photoresist on to a substrate provided with a low-dielectric constant interlayer dielectric film, and a copper wiring and/or a copper alloy wiring,
  forming a photoresist pattern by conducting a selective exposure and development treatment on the photoresist,
  conducting a dry etching treatment on the organosiloxane thin film, and the low-dielectric constant interlayer dielectric film using the resist pattern as a mask, and
  removing the organosiloxane thin film, a dry etching residue, and the photoresist using a cleaning liquid composition,
  wherein the cleaning liquid composition comprises:
  0.05 to 25% by weight of a quaternary ammonium hydroxide,
  0.001 to 1.0% by weight of potassium hydroxide,
  5 to 85% by weight of a water-soluble organic solvent, and
  0.0005 to 10% by weight of pyrazoles.

8) A cleaning method for a semiconductor device comprising:
  layering in the order from bottom to top a hard mask, an organosiloxane thin film, and a photoresist on to a substrate provided with a low-dielectric constant interlayer dielectric film, and a copper wiring and/or a copper alloy wiring,
  forming a photoresist pattern by conducting a selective exposure and development treatment on the photoresist,
  conducting a dry etching treatment on the hard mask, the organosiloxane thin film, and the low-dielectric constant interlayer dielectric film using the photoresist pattern as a mask, and
  removing the organosiloxane thin film, a dry etching residue, and the photoresist using a cleaning liquid composition,
  wherein the cleaning liquid composition comprises:
  0.05 to 25% by weight of a quaternary ammonium hydroxide,
  0.001 to 1.0% by weight of potassium hydroxide,
  5 to 85% by weight of a water-soluble organic solvent, and
  0.0005 to 10% by weight of pyrazoles.

9) The cleaning method for a semiconductor device according to 7 or 8 above, wherein the quaternary ammonium hydroxide is one or more kinds selected from the group consisting of tetramethylammonium hydroxide, tetraethylammonium hydroxide, tetrapropylammonium hydroxide, tetrabutylammonium hydroxide, and choline.

10) The cleaning method for a semiconductor device according to any of 7) to 9) above, wherein the water-soluble organic solvent is one or more kinds selected from the group consisting of alcohols selected from ethanol, 2-propanol, ethylene glycol, propylene glycol, glycerine, diethylene glycol, xylitol, and sorbitol; glycol ethers selected from diethylene glycol monomethyl ether, diethylene glycol monoethyl ether, diethylene glycol monobutyl ether, diethylene glycol dimethyl ether, dipropylene glycol monomethyl ether, and dipropylene glycol monopropyl ether; amides selected from N,N-dimethyl formamide, N,N-dimethyl acetamide, and N-methyl-2-pyrrolidone; dimethyl sulfoxide; and 1,3-dimethyl-2-imidazolidinone.

11) The cleaning method for a semiconductor device according to any of 7) to 10) above, wherein the pyrazole is one or more kinds selected from the group consisting of pyrazole, 3,5-dimethylpyrazole, 3-methyl-5-pyrazolone, and 3-amino-5-hydroxypyrazole.

12) The cleaning method for a semiconductor device according to any of 7) to 11) above, wherein the copper wiring and/or the copper alloy wiring has a wiring width of 100 nm or less.

13) A production process for a semiconductor device comprising:
  layering in the order from bottom to top an organosiloxane thin film, and a photoresist on to a substrate provided with a low-dielectric constant interlayer dielectric film, and a copper wiring and/or a copper alloy wiring,
  forming a photoresist pattern by conducting a selective exposure and development treatment on the photoresist,
  conducting a dry etching treatment on the organosiloxane thin film, and the low-dielectric constant interlayer dielectric film using the resist pattern as a mask, and
  removing the organosiloxane thin film, a dry etching residue, and the photoresist using a cleaning liquid composition,
  wherein the cleaning liquid composition comprises:
  0.05 to 25% by weight of a quaternary ammonium hydroxide,
  0.001 to 1.0% by weight of potassium hydroxide,
  5 to 85% by weight of a water-soluble organic solvent, and
  0.0005 to 10% by weight of pyrazoles.

14) A production process for a semiconductor device comprising:
  layering in the order from bottom to top a hard mask, an organosiloxane thin film, and a photoresist on to a substrate provided with a low-dielectric constant interlayer dielectric film, and a copper wiring and/or a copper alloy wiring,
  forming a photoresist pattern by conducting a selective exposure and development treatment on the photoresist,
  conducting a dry etching treatment on the hard mask, the organosiloxane thin film, and the low-dielectric constant interlayer dielectric film using the photoresist pattern as a mask, and
  removing the organosiloxane thin film, a dry etching residue, and the photoresist using a cleaning liquid composition, wherein the cleaning liquid composition comprises:

0.05 to 25% by weight of a quaternary ammonium hydroxide, 0.001 to 1.0% by weight of potassium hydroxide, 5 to 85% by weight of a water-soluble organic solvent, and 0.0005 to 10% by weight of pyrazoles.

15) The production process for a semiconductor device according to 13) or 14) above, wherein the quaternary ammonium hydroxide is one or more kinds selected from the group consisting of tetramethylammonium hydroxide, tetraethylammonium hydroxide, tetrapropylammonium hydroxide, tetrabutylammonium hydroxide, and choline.

16) The production process for a semiconductor device according to any of 13) to 15) above, wherein the water-soluble organic solvent is one or more kinds selected from the group consisting of alcohols selected from ethanol, 2-propanol, ethylene glycol, propylene glycol, glycerine, diethylene glycol, xylitol, and sorbitol; glycol ethers selected from diethylene glycol monomethyl ether, diethylene glycol monoethyl ether, diethylene glycol monobutyl ether, diethylene glycol dimethyl ether, dipropylene glycol monomethyl ether, and dipropylene glycol monopropyl ether; amides selected from N,N-dimethyl formamide, N,N-dimethyl acetamide, and N-methyl-2-pyrrolidone; dimethyl sulfoxide; and 1,3-dimethyl-2-imidazolidinone.

17) The production process for a semiconductor device according to any of 13) to 16) above, wherein the pyrazole is one or more kinds selected from the group consisting of pyrazole, 3,5-dimethylpyrazole, 3-methyl-5-pyrazolone, and 3-amino-5-hydroxypyrazole.

18) The production process for a semiconductor device according to any of 13) to 17) above, wherein the copper wiring and/or the copper alloy wiring has a wiring width of 100 nm or less.

Advantageous Effects of Invention

By using a cleaning liquid composition and a cleaning method for a semiconductor device according to the present invention, it becomes possible in a production process for a semiconductor device to suppress damage to a low-dielectric constant interlayer dielectric film, a wiring material, such as copper or a copper alloy, a hard mask, a barrier metal, a barrier dielectric film, and a hard mask, and to remove an organosiloxane thin film, a dry etching residue, and a photoresist on a treatment target surface, so that a high precision and high quality semiconductor device can be produced at a high yield.

DESCRIPTION OF EMBODIMENTS

Cleaning Liquid Composition

Figure 1:
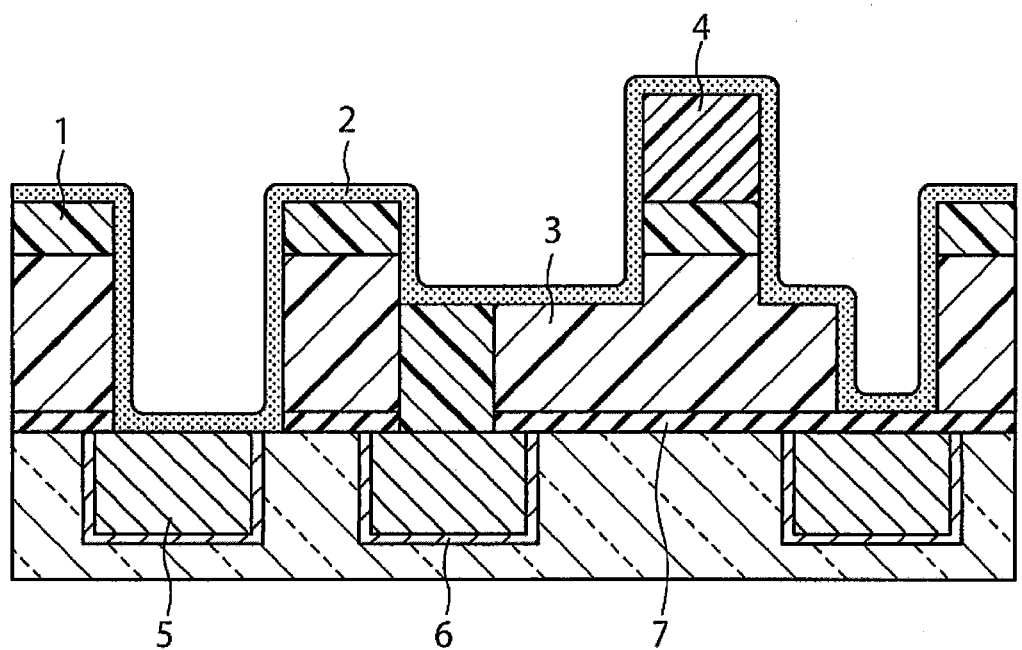
FIG. 1 is a cross-sectional view of a copper wiring structure of a semiconductor device before removal of an organosiloxane thin film, a dry etching residue, and a photoresist.

A cleaning liquid composition according to the present invention (hereinafter occasionally referred to as a "cleaning liquid") contains a quaternary ammonium hydroxide, potassium hydroxide, a water-soluble organic solvent, and pyrazoles, and more preferably contains additionally water.

A cleaning liquid for an organosiloxane thin film, a dry etching residue, and a photoresist according to the present invention is used in a process for producing a semiconductor device and required to suppress damage to a low-dielectric constant interlayer dielectric film, a wiring material, such as copper and a copper alloy, a hard mask, a barrier metal, a barrier dielectric film, and a hard mask.

Specific examples of a quaternary ammonium hydroxide used according to the present invention include tetramethylammonium hydroxide, tetraethylammonium hydroxide, tetrapropylammonium hydroxide, tetrabutylammonium hydroxide, and choline. The quaternary ammonium hydroxides may be added singly or in a combination of two or more kinds thereof.

The concentration range of the quaternary ammonium hydroxide used according to the present invention is from 0.05 to 25% by weight, preferably from 0.1 to 20% by weight, more preferably from 0.5 to 20% by weight, and especially preferably from 1 to 18% by weight. When the concentration of the quaternary ammonium hydroxide is within the range, removal of an organosiloxane thin film and a photoresist can be conducted effectively.

The concentration range of potassium hydroxide used according to the present invention is from 0.001 to 1.0% by weight, preferably from 0.005 to 0.5% by weight, more preferably from 0.05 to 0.5% by weight, and especially preferably from 0.05 to 0.3% by weight. When the concentration is within the range, removal of an organosiloxane thin film can be conducted effectively. When the concentration of potassium hydroxide is 1.0% by weight or less, damage to a low-k film can be suppressed.

Examples of a water-soluble organic solvent used according to the present invention include alcohols selected from ethanol, 2-propanol, ethylene glycol, propylene glycol, glycerine, diethylene glycol, xylitol, and sorbitol; glycol ethers selected from diethylene glycol monomethyl ether, diethylene glycol monoethyl ether, diethylene glycol monobutyl ether, diethylene glycol dimethyl ether, and dipropylene glycol monomethyl ether; amides selected from N,N-dimethyl acetamide, and N-methyl-2-pyrrolidone; dimethyl sulfoxide; and 1,3-dimethyl-2-imidazolidinone.

The water-soluble organic solvents used according to the present invention may be used singly or in a combination of two or more kinds thereof. The concentration range of the water-soluble organic solvent is from 5 to 85% by weight, preferably from 10 to 80% by weight, more preferably from 15 to 70% by weight, and especially preferably from 15 to 50% by weight. When the concentration of the water-soluble organic solvent is within the range, removal of an organosiloxane thin film can be conducted effectively. When the concentration of the water-soluble organic solvent is 5% by weight or more, damage to copper and tungsten can be suppressed, and is 85% by weight or less damage to a low-k film can be suppressed.

Pyrazoles used according to the present invention are pyrazole, 3,5-dimethylpyrazole, 3-methyl-5-pyrazolone, and 3-amino-5-hydroxypyrazole.

The pyrazoles used according to the present invention may be used singly or in a combination of two or more kinds thereof. The concentration range of the pyrazole is from 0.0005 to 10% by weight, preferably from 0.001 to 7% by weight, more preferably from 0.05 to 5% by weight, and especially preferably from 0.05 to 3% by weight. When the concentration of the pyrazole is within the range, damage to copper can be suppressed.

A cleaning liquid composition according to the present invention preferably does not contain azoles other than the pyrazoles. Examples of azoles other than the pyrazoles include imidazole, thiazole, oxazole, triazole, and tetrazole.

A cleaning liquid according to the present invention may contain additives used heretofore in a cleaning liquid for a semiconductor to the extent that an object of the present invention is not impaired. Examples of such additives as may be added include a surfactant, and a defoaming agent.

The temperature at which a cleaning liquid according to the present invention is used is preferably in a range from 20 to 80° C., and more preferably from 25 to 70° C., and may be selected appropriately depending on an etching condition, or a semiconductor substrate. A production process according to the present invention may use concurrently, if necessary, ultrasonic waves. The time duration for which a cleaning liquid according to the present invention is used is preferably in a range from 0.3 to 20 min, and more preferably from 0.5 to 10 min, and may be selected appropriately depending on an etching condition, or a semiconductor substrate used. As a rinsing liquid after use of a cleaning liquid according to the present invention, an organic solvent such as an alcohol may be used, however rinsing with water is also adequate.

Cleaning Method for Semiconductor Device

The 1st embodiment of a cleaning method for a semiconductor device according to the present invention includes:

layering in the order from bottom to top an organosiloxane thin film 1, and a photoresist on to a substrate provided with a low-dielectric constant interlayer dielectric film, and a copper wiring and/or a copper alloy wiring, forming a photoresist pattern by conducting a selective exposure and development treatment on the photoresist, conducting a dry etching treatment on the organosiloxane thin film, and the low-dielectric constant interlayer dielectric film using the resist pattern as a mask, and removing the organosiloxane thin film, a dry etching residue, and the photoresist using a cleaning liquid composition on a semiconductor device.

The 2nd embodiment of a cleaning method for a semiconductor device according to the present invention includes:

layering in the order from bottom to top a hard mask, an organosiloxane thin film, and a photoresist on to a substrate provided with a low-dielectric constant interlayer dielectric film, and a copper wiring and/or a copper alloy wiring, forming a photoresist pattern by conducting a selective exposure and development treatment on the photoresist, conducting a dry etching treatment on the hard mask, the organosiloxane thin film, and the low-dielectric constant interlayer dielectric film using the photoresist pattern as a mask, and removing the organosiloxane thin film, a dry etching residue, and the photoresist using a cleaning liquid composition on a semiconductor device having been conducted with the dry etching treatment.

Production Process for Semiconductor Device

The 1st embodiment of a production process for a semiconductor device according to the present invention includes:

layering in the order from bottom to top an organosiloxane thin film, and a photoresist on to a substrate provided with a low-dielectric constant interlayer dielectric film, and a copper wiring and/or a copper alloy wiring, forming a photoresist pattern by conducting a selective exposure and development treatment on the photoresist, conducting a dry etching treatment on the organosiloxane thin film, and the low-dielectric constant interlayer dielectric film using the resist pattern as a mask, and removing the organosiloxane thin film, a dry etching residue, and the photoresist using a cleaning liquid composition.

The 2nd embodiment of a production process for a semiconductor device according to the present invention includes:

layering in the order from bottom to top a hard mask, an organosiloxane thin film, and a photoresist on to a substrate provided with a low-dielectric constant interlayer dielectric film, and a copper wiring and/or a copper alloy wiring, forming a photoresist pattern by conducting a selective exposure and development treatment on the photoresist, conducting a dry etching treatment on the hard mask, the organosiloxane thin film, and the low-dielectric constant interlayer dielectric film using the photoresist pattern as a mask, and removing the organosiloxane thin film, a dry etching residue, and the photoresist using a cleaning liquid composition.

A cleaning liquid composition according to the present invention can be used irrespective of the wiring width of a copper wiring and/or a copper alloy wiring formed on a substrate of a semiconductor device. Further, there is no particular restriction on the wiring width of a copper wiring and/or a copper alloy wiring formed on a substrate of a semiconductor device in a cleaning method and a production process for a semiconductor device according to the present invention. In accordance with the present invention, the wiring width of a copper wiring and/or a copper alloy wiring can be thin, and it can be, for example, preferably 100 nm or less, more preferably from 10 to 70 nm, and especially preferably from 20 to 50 nm.

Examples of a semiconductor device and a display element, to which the present invention is applicable, include a substrate material, such as silicon, amorphous silicon, polysilicon, and glass; an insulating material, such as silicon oxide, silicon nitride, silicon carbide, and a derivative thereof; a barrier material, such as titanium, titanium nitride, tantalum, tantalum nitride, ruthenium, and ruthenium oxide; a wiring material, such as copper, a copper alloy, tungsten, and titanium-tungsten; a compound semiconductor, such as gallium-arsenic, gallium-phosphorus, indium-phosphorus, indium-gallium-arsenic, and indium-aluminum-arsenic; and an oxide semiconductor such as chromium oxide.

As a low-k film are used generally OCD (trade name, made by Tokyo Ohka Kogyo Co., Ltd.) based on hydroxysilsesquioxane (HSQ) or methylsilsesquioxane (MSQ); Black Diamond (trade name, made by Applied Materials, Inc.), Aurora (trade name, made by ASM International N.V.), and Coral (trade name, made by Novellus Systems, Inc.) based on a carbon doped silicon oxide (SiOC); and Orion (trade name, made by Trikon Technologies Inc.) of an inorganic type; provided that a low-k film is not limited to the above.

As a barrier metal are used generally tantalum, tantalum nitride, titanium, titanium nitride, ruthenium, manganese, magnesium, cobalt as well as oxides thereof, provided that a barrier metal is not limited to the above.

As a barrier dielectric film are used generally silicon nitride, silicon carbide, and silicon carbide nitride, provided that a barrier dielectric film is not limited to the above.

As a hard mask are used generally an oxide, a nitride, or a carbide of silicon, titanium, aluminum, and tantalum. Two or more kinds of the materials may be used forming layers. A hard mask is not limited to the above.

EXAMPLES

The present invention will be described more specifically below by way of Examples and Comparative Examples, provided that the present invention is not restricted in any way by Examples.
Measurement Instrument: SEM Observation was Made with: Ultra-High Resolution Field Emission Scanning Electron Microscope S-5500 (Made by Hitachi High-Technologies Corp.)
Evaluation:
I. Removal result of organosiloxane thin film
  ○: An organosiloxane thin film is removed completely.
  ×: An organosiloxane thin film is remove insufficiently.
II. Removal result of dry etching residue
  ○: A dry etching residue is removed completely.
  ×: A dry etching residue is remove insufficiently.
III. Removal result of photoresist
  ○: A photoresist is removed completely.
  ×: A photoresist is remove insufficiently.
IV. Damage to copper
  ⊚: There is no recognizable change on copper compared to the status before cleaning.
  ○: Slight roughness is recognized on a copper surface.
  ×: A large hole is recognized on copper.
V. Damage to tungsten
  ⊚: There is no recognizable change on tungsten compared to the status before cleaning.
  ○: Slight roughness is recognized on a tungsten surface.
  ×: A large hole is recognized on tungsten.
VI. Damage to low-k film
  ⊚: There is no recognizable change on a low-k film compared to the status before cleaning.
  ○: A low-k film is slightly depressed.
  ×: A low-k film is remarkably depressed.
VII. Damage to hard mask
  ○: There is no recognizable change on a hard mask compared to the status before cleaning.
  ×: Separation or deformation is recognized on a hard mask.

Examples 1 to 40

Figure 2:
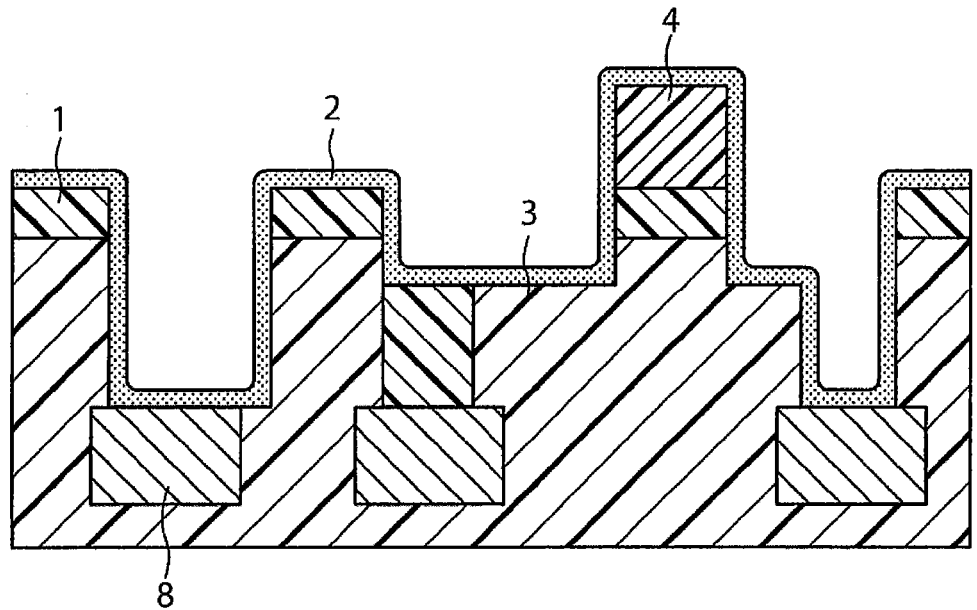
FIG. 2 is a cross-sectional view of a tungsten plug structure of a semiconductor device before removal of an organosiloxane thin film, a dry etching residue, and a photoresist.
Figure 3:
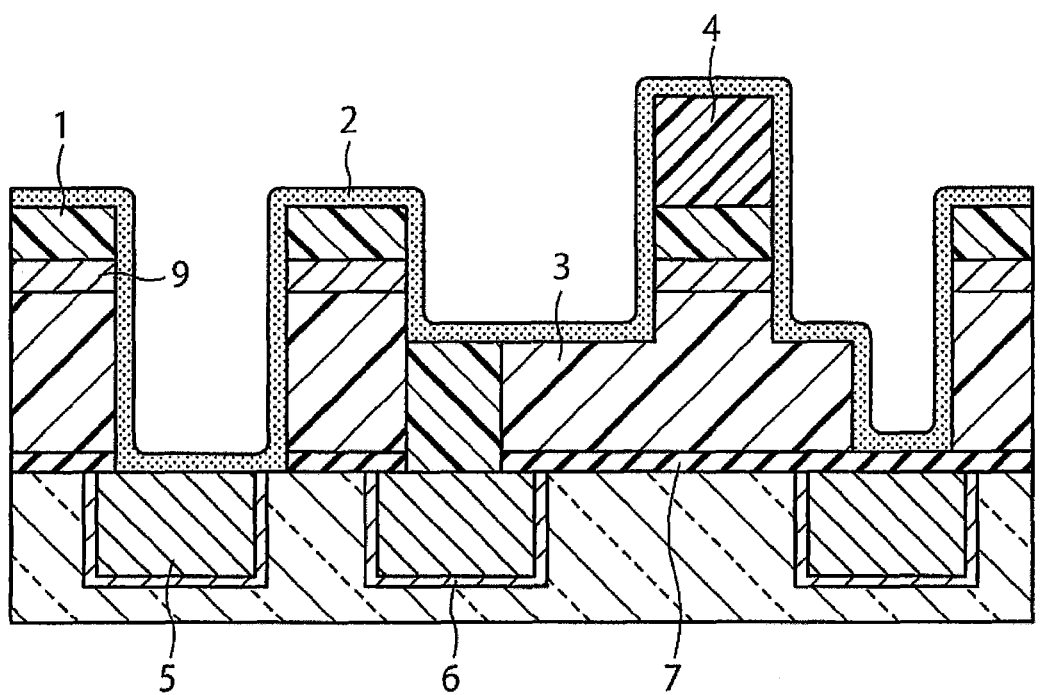
FIG. 3 is a cross-sectional view of a copper wiring structure of a semiconductor device including a hard mask before removal of an organosiloxane thin film, a dry etching residue, and a photoresist.

Semiconductor devices having a cross-section of a wiring structure shown in FIG. 1, FIG. 2, or FIG. 3 were used for tests. The test sample was immersed in a cleaning liquid set forth in Table 1 at a temperature and for a time period set forth in Table 2 so as to remove an organosiloxane thin film 1, a dry etching residue 2, and a photoresist 4, then rinsed with ultrapure water, and dried by blowing a dry nitrogen gas. The semiconductor device after the cleaning was observed with a SEM to evaluate the removal result of the organosiloxane thin film 1, the dry etching residue 2, and the photoresist 4, and the damages to copper 5, tungsten 8, a barrier metal 6, a barrier dielectric film 7, a low-k film 3, and a hard mask 9.

It is clear that an organosiloxane thin film 1, a dry etching residue 2, and a photoresist 4 were removed completely, while damages to copper 5, tungsten 8, a low-k film 3, and a hard mask 9 were prevented, in Examples 1 to 40, in which a cleaning liquid of the present invention was applied, shown in Table 2.

Comparative Example 1

A semiconductor device shown in FIG. 1, FIG. 2, or FIG. 3 was cleaned with an aqueous solution (Table 3, cleaning liquid 3A) described in Patent Literature 1 composed of 10% by weight of tetramethylammonium hydroxide, 0.02% by weight of potassium hydroxide, 47.48% by weight of N-methyl-2-pyrrolidone, 1.5% by weight of thioglycerol, 1.0% by weight of IRGAMET42, and 40% by weight of water. The cleaning conditions and the evaluation result are shown in Table 4. Although a dry etching residue 2, and a photoresist 4 could be removed, an organosiloxane thin film 1 could not be removed. Although damages to a low-k film 3, and a hard mask 9 were prevented, large holes were recognized on copper 5 and tungsten 8. Therefore it can be concluded that the method of Patent Literature 1 cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 2

A semiconductor device shown in FIG. 1, FIG. 2, or FIG. 3 was cleaned with an aqueous solution (Table 3, cleaning liquid 3B) described in Patent Literature 2 composed of 10% by weight of tetramethylammonium hydroxide, 0.02% by weight of potassium hydroxide, 40% by weight of diethylene glycol monoethyl ether, 2% by weight of 2-ethyl-4-methylimidazole, and 47.98% by weight of water. The cleaning conditions and the evaluation result are shown in Table 4. Although a dry etching residue 2, and a photoresist 4 could be removed, an organosiloxane thin film 1 could not be removed. Although damages to a low-k film 3, and tungsten 8 were prevented, a large hole was recognized on copper 5, and a hard mask 9 was peeled off. Therefore it can be concluded that the method of Patent Literature 2 cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 3

A semiconductor device shown in FIG. 1, FIG. 2, or FIG. 3 was cleaned with an aqueous solution (Table 3, cleaning liquid 3C) described in Patent Literature 3 composed of 1.0% by weight of tetramethylammonium hydroxide, 1.0% by weight of hydroxyamine, 3% by weight of ethylene diamine, 0.1% by weight of pyrazole, and 94.9% by weight of water. The cleaning conditions and the evaluation result are shown in Table 4. Although a dry etching residue 2, and a photoresist 4 could be removed, an organosiloxane thin film 1 could not be removed. Although damages to a low-k film 3, and a hard mask 9 were prevented, large holes were recognized on copper 5 and tungsten 8. Therefore it can be concluded that the method of Patent Literature 3 cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 4

A semiconductor device shown in FIG. 1, FIG. 2, or FIG. 3 was cleaned with an aqueous solution (Table 3, cleaning liquid 3D) described in Patent Literature 4 composed of 18% by weight of tetramethylammonium hydroxide, 3% by weight of hydrogen peroxide, 5% by weight of pyrazole, and 74% by weight of water. The cleaning conditions and the evaluation result are shown in Table 4. Although a photoresist 4 could be removed, an organosiloxane thin film 1 and a dry etching residue 2 could not be removed. Although damage to a low-k film 3 was prevented, large holes were recognized on copper 5, tungsten 8, and a hard mask 9. Therefore it can be concluded that the method of Patent Literature 4 cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 5

A semiconductor device shown in FIG. 1, FIG. 2, or FIG. 3 was cleaned with an aqueous solution (Table 3, cleaning liquid 3E) described in Patent Literature 5 composed of 2% by weight of tetramethylammonium hydroxide, 30% by weight of pyrazole, 60% by weight of diethylene glycol monobutyl ether, and 8% by weight of water. The cleaning conditions and the evaluation result are shown in Table 4. Although a dry etching residue 2, and a photoresist 4 could be removed, an organosiloxane thin film 1 could not be removed. Although damage to a low-k film 3 was prevented, large holes were recognized on copper 5 and tungsten 8, and a hard mask was peeled off. Therefore it can be concluded that the method of Patent Literature 5 cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 6

A semiconductor device shown in FIG. 1, FIG. 2, or FIG. 3 was cleaned with an aqueous solution (Table 3, cleaning liquid 3F) described in Patent Literature 6 composed of 26% by weight of nitric acid, 3% by weight of sodium chlorate, 1.5% by weight of ferrous chloride, 1.0% by weight of pyrazole, and 68.5% by weight of water. The cleaning conditions and the evaluation result are shown in Table 4. Although a dry etching residue 2 could be removed, an organosiloxane thin film 1 and a photoresist 4 could not be removed. Although damage to a low-k film 3 was prevented, large holes were recognized on copper 5, tungsten 8, and a hard mask 9. Therefore it can be concluded that the method of Patent Literature 6 cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 7

A semiconductor device shown in FIG. 1, FIG. 2, or FIG. 3 was cleaned with an aqueous solution (Table 3, cleaning liquid 3G) described in Patent Literature 7 composed of 0.1% by weight of nitric acid, 4% by weight of sulfuric acid, 0.06% by weight of ammonium fluoride, 15% by weight of pyrazole, and 80.84% by weight of water. The cleaning conditions and the evaluation result are shown in Table 4. Although a dry etching residue 2 could be removed, an organosiloxane thin film 1 and a photoresist 4 could not be removed. Although damages to a low-k film 3 and tungsten 8 were prevented, large holes were recognized on copper 5, and a hard mask 9 Therefore it can be concluded that the method of Patent Literature 7 cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 8

A semiconductor device shown in FIG. 1, FIG. 2, or FIG. 3 was cleaned with an aqueous solution (Table 3, cleaning liquid 3H) described in Patent Literature 8 composed of 2.5% by weight of mandelic acid, 0.1% by weight of pyrazole, and 97.4% by weight of water. The cleaning conditions and the evaluation result are shown in Table 4. Although a dry etching residue 2 could be removed, an organosiloxane thin film 1 and a photoresist 4 could not be removed. Although damages to a low-k film 3, tungsten 8, and a hard mask 9 were prevented, a large hole was recognized on copper 5. Therefore it can be concluded that the method of Patent Literature 8 cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 9

A semiconductor device shown in FIG. 1, FIG. 2, or FIG. 3 was cleaned with an aqueous solution (Table 3, cleaning liquid 3I) composed of 0.2% by weight of potassium hydroxide, 50% by weight of diethylene glycol monomethyl ether, 0.1% by weight of pyrazole, and 49.7% by weight of water. The cleaning conditions and the evaluation result are shown in Table 4. An organosiloxane thin film 1, a dry etching residue 2, and a photoresist 4 could not be removed. Although damages to a low-k film 3, and a hard mask 9 were prevented, large holes were recognized on copper 5 and tungsten 8. Therefore it can be concluded that the cleaning liquid 3I cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 10

A semiconductor device shown in FIG. 1, FIG. 2, or FIG. 3 was cleaned with an aqueous solution (Table 3, cleaning liquid 3J) composed of 2% by weight of tetramethylammonium hydroxide, 50% of diethylene glycol monomethyl ether, 0.1% of pyrazole, and 47.9% by weight of water. The cleaning conditions and the evaluation result are shown in Table 4. Although a dry etching residue 2, and a photoresist 4 could be removed, an organosiloxane thin film 1 could not be removed. Damages to copper 5, a low-k film 3, tungsten 8, and a hard mask 9 were prevented. Since an organosiloxane thin film 1 cannot be removed even after immersion as long as 30 min, which is beyond a reasonably acceptable level, it can be concluded that the cleaning liquid 3J cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 11

A semiconductor device shown in FIG. 1, FIG. 2, or FIG. 3 was cleaned with an aqueous solution (Table 3, cleaning liquid 3K) composed of 2% by weight of tetramethylammonium hydroxide, 0.2% by weight of potassium hydroxide, 0.1% of pyrazole, and 97.7% by weight of water. The cleaning conditions and the evaluation result are shown in Table 4. Although a photoresist 4 could be removed, an organosiloxane thin film 1, and a dry etching residue 2 could not be removed. Although damages to a low-k film 3, tungsten 8, and a hard mask 9 were prevented, a large hole was recognized on copper 5. Therefore it can be concluded that the cleaning liquid 3K cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 12

A semiconductor device shown in FIG. 1, FIG. 2, or FIG. 3 was cleaned with an aqueous solution (Table 3, cleaning liquid 3L) composed of 2% by weight of tetramethylammonium hydroxide, 0.2% by weight of potassium hydroxide, 50% by weight of diethylene glycol monomethyl ether, and 47.8% by weight of water. The cleaning conditions and the evaluation result are shown in Table 4. Although a dry etching residue 2, and a photoresist 4 could be removed, an organosiloxane thin film 1 could not be removed. Although damages to a low-k film 3, tungsten 8, and a hard mask 9 were prevented, a large hole was recognized on copper 5. Therefore it can be concluded that the cleaning liquid 3L cannot be used for an object of suppressing damages to a low-k film, copper or a copper alloy, a barrier metal, a barrier dielectric film, and a hard mask, and removing an organosiloxane thin film, a dry etching residue, and a photoresist on a treatment target surface in a production process for a semiconductor device which is a target of the present invention (Table 4).

Comparative Example 13

A semiconductor device shown in FIG. 1, FIG. 2, or FIG. 3 was cleaned with an aqueous solution (Table 3, cleaning liquid 3M) composed of 2% by weight of tetramethylammonium hydroxide, 0.2% by weight of potassium hydroxide, 50% by weight of diethylene glycol monomethyl ether, 0.1% by weight of 1-methyl-1H-benzotriazole, and 47.7% by weight of water. The cleaning conditions and the evaluation result are shown in Table 4. Although a dry etching residue 2, and a photoresist 4 could be removed, an organosiloxane thin film 1 could not be removed. Although damages to a low-k film 3, tungsten 8, and a hard mask 9 were prevented, a large hole was recognized on copper 5. Therefore it can be concluded that 1-methyl-1H-benzotriazole described in Patent Literature 3 has no effect as an anticorrosive for copper to be combined with a cleaning liquid containing a quaternary ammonium hydroxide, potassium hydroxide, a water-soluble organic solvent, and water, which is a target of the present invention (Table 4).

Comparative Example 14

A semiconductor device shown in FIG. 1, FIG. 2, or FIG. 3 was cleaned with an aqueous solution (Table 3, cleaning liquid 3N) composed of 2% by weight of tetramethylammonium hydroxide, 0.2% by weight of potassium hydroxide, 50% by weight of diethylene glycol monomethyl ether, 0.2% by weight of benzotriazole, 0.2% by weight of tolyltriazole, 1% by weight of ethanol, and 46.4% by weight of water. The cleaning conditions and the evaluation result are shown in Table 4. Although a dry etching residue 2, and a photoresist 4 could be removed, an organosiloxane thin film 1 could not be removed. Although damages to a low-k film 3, tungsten 8, and a hard mask 9 were prevented, a large hole was recognized on copper 5. Therefore it can be concluded that a combination of benzotriazole, tolyltriazole, and ethanol described in Patent Literature 4 has no effect as an anticorrosive for copper to be combined with a cleaning liquid containing a quaternary ammonium hydroxide, potassium hydroxide, a water-soluble organic solvent, and water, which is a target of the present invention (Table 4).

Comparative Example 15

A semiconductor device shown in FIG. 1, FIG. 2, or FIG. 3 was cleaned with an aqueous solution (Table 3, cleaning liquid 3O) composed of 2% by weight of tetramethylammonium hydroxide, 0.2% by weight of potassium hydroxide, 50% by weight of diethylene glycol monomethyl ether, 5% by weight of ethanolamine, and 42.8% by weight of water. The cleaning conditions and the evaluation result are shown in Table 4. Although a dry etching residue 2, and a photoresist 4 could be removed, an organosiloxane thin film 1 could not be removed. Although damages to a low-k film 3, and a hard mask 9 were prevented, large holes were recognized on copper 5, and tungsten 8. Therefore it can be concluded that ethanolamine described in Patent Literature 5 has no effect as an anticorrosive for copper to be combined with a cleaning liquid containing a quaternary ammonium hydroxide, potassium hydroxide, a water-soluble organic solvent, and water, which is a target of the present invention (Table 4).

Comparative Example 16

A semiconductor device shown in FIG. 1, FIG. 2, or FIG. 3 was cleaned with an aqueous solution (Table 3, cleaning liquid 3P) composed of 2% by weight of tetramethylammonium hydroxide, 0.2% by weight of potassium hydroxide, 50% by weight of diethylene glycol monomethyl ether, 1% by weight of benzotriazole, and 46.8% by weight of water. The cleaning conditions and the evaluation result are shown in Table 4. Although a dry etching residue 2, and a photoresist 4 could be removed, an organosiloxane thin film 1 could not be removed. Although damages to a low-k film 3, tungsten 8, and a hard mask 9 were prevented, a large hole was recognized on copper 5. Therefore it can be concluded that benzotriazole described in Patent Literature 6 and Patent Literature 9 has no effect as an anticorrosive for copper to be combined with a cleaning liquid containing a quaternary ammonium hydroxide, potassium hydroxide, a water-soluble organic solvent, and water, which is a target of the present invention (Table 4).

Comparative Example 17

A semiconductor device shown in FIG. 1, FIG. 2, or FIG. 3 was cleaned with an aqueous solution (Table 3, cleaning liquid 3Q) composed of 2% by weight of tetramethylammonium hydroxide, 0.2% by weight of potassium hydroxide, 50% by weight of diethylene glycol monomethyl ether, 0.5% by weight of 5-aminotetrazole, and 47.3% by weight of water. The cleaning conditions and the evaluation result are shown in Table 4. Although a dry etching residue 2, and a photoresist 4 could be removed, an organosiloxane thin film 1 could not be removed. Although damages to a low-k film 3, tungsten 8, and a hard mask 9 were prevented, a large hole was recognized on copper 5. Therefore it can be concluded that 5-aminotetrazole has no effect as an anticorrosive for copper to be combined with a cleaning liquid containing a quaternary ammonium hydroxide, potassium hydroxide, a water-soluble organic solvent, and water, which is a target of the present invention (Table 4).

Comparative Example 18

A semiconductor device shown in FIG. 1, FIG. 2, or FIG. 3 was cleaned with an aqueous solution (Table 3, cleaning liquid 3R) composed of 2% by weight of tetramethylammonium hydroxide, 0.2% by weight of potassium hydroxide, 50% by weight of diethylene glycol monomethyl ether, 3% by weight of pyridine, and 44.8% by weight of water. The cleaning conditions and the evaluation result are shown in Table 4. Although a dry etching residue 2, and a photoresist 4 could be removed, an organosiloxane thin film 1 could not be removed. Although damages to a low-k film 3, tungsten 8, and a hard mask 9 were prevented, a large hole was recognized on copper 5. Therefore it can be concluded that pyridine has no effect as an anticorrosive for copper to be combined with a cleaning liquid containing a quaternary ammonium hydroxide, potassium hydroxide, a water-soluble organic solvent, and water, which is a target of the present invention (Table 4).

Comparative Example 19

A semiconductor device shown in FIG. 1, FIG. 2, or FIG. 3 was cleaned with an aqueous solution (Table 3, cleaning liquid 3S) composed of 2% by weight of tetramethylammonium hydroxide, 0.2% by weight of potassium hydroxide, 50% by weight of diethylene glycol monomethyl ether, 0.8% by weight of 1-vinyl imidazole, and 47% by weight of water. The cleaning conditions and the evaluation result are shown in Table 4. Although a photoresist 4 could be removed, an organosiloxane thin film 1, and a dry etching residue 2 could not be removed. Although damages to a low-k film 3, tungsten 8, and a hard mask 9 were prevented, a large hole was recognized on copper 5. Therefore it can be concluded that 1-vinyl imidazole has no effect as an anticorrosive for copper to be combined with a cleaning liquid containing a quaternary ammonium hydroxide, potassium hydroxide, a water-soluble organic solvent, and water, which is a target of the present invention (Table 4).

Comparative Example 20

A semiconductor device shown in FIG. 1, FIG. 2, or FIG. 3 was cleaned with an aqueous solution (Table 3, cleaning liquid 3T) composed of 2% by weight of tetramethylammonium hydroxide, 0.2% by weight of potassium hydroxide, 50% by weight of diethylene glycol monomethyl ether, 0.02% by weight of imidazole, and 47.78% by weight of water. The cleaning conditions and the evaluation result are shown in Table 4. Although a dry etching residue 2, and a photoresist 4 could be removed, an organosiloxane thin film 1 could not be removed. Although damages to a low-k film 3, tungsten 8, and a hard mask 9 were prevented, a large hole was recognized on copper 5. Therefore it can be concluded that imidazole has no effect as an anticorrosive for copper to be combined with a cleaning liquid containing a quaternary ammonium hydroxide, potassium hydroxide, a water-soluble organic solvent, and water, which is a target of the present invention (Table 4).

TABLE 1

| Cleaning liquid | Quaternary ammonium hydroxide | | Potassium hydroxide Concentration % by weight | Water-soluble organic solvent | | Pyrazoles | | Water Concentration % by weight |
|---|---|---|---|---|---|---|---|---|
| | Kind | Concentration % by weight | | Kind | Concentration % by weight | Kind | Concentration % by weight | |
| 1A | TMAH | 0.1 | 0.5 | Diethylene glycol monomethyl ether | 80 | Pyrazole | 0.1 | 19.3 |
| 1B | TMAH | 20 | 0.05 | Diethylene glycol monomethyl ether | 18 | Pyrazole | 0.1 | 61.85 |
| 1C | TEAH | 2 | 0.2 | Diethylene glycol monobutyl ether | 50 | Pyrazole | 0.5 | 47.3 |
| 1D | TPAH | 2 | 0.2 | Diethylene glycol monobutyl ether | 50 | Pyrazole | 0.1 | 47.7 |
| 1E | TBAH | 2 | 0.2 | Diethylene glycol monobutyl ether | 50 | Pyrazole | 0.1 | 47.7 |
| 1F | Choline | 5 | 0.2 | Diethylene glycol monobutyl ether | 50 | Pyrazole | 0.1 | 44.7 |
| 1G | TMAH | 2 | 0.2 | Diethylene glycol monoethyl ether | 50 | Pyrazole | 0.1 | 47.7 |

TABLE 1-continued

| Cleaning liquid | Quaternary ammonium hydroxide Kind | Concentration % by weight | Potassium hydroxide Concentration % by weight | Water-soluble organic solvent Kind | Concentration % by weight | Pyrazoles Kind | Concentration % by weight | Water Concentration % by weight |
|---|---|---|---|---|---|---|---|---|
| 1H | TMAH | 2 | 0.2 | Diethylene glycol monobutyl ether | 50 | Pyrazole | 0.1 | 47.7 |
| 1I | TMAH | 2 | 0.2 | Diethylene glycol dimethyl ether | 50 | Pyrazole | 0.1 | 47.7 |
| 1J | TMAH | 2 | 0.2 | Dipropylene glycol monomethyl ether | 50 | Pyrazole | 0.1 | 47.7 |
| 1K | TMAH | 2 | 0.2 | N,N-dimethyl acetamide | 50 | Pyrazole | 0.1 | 47.7 |
| 1L | TMAH | 2 | 0.2 | N-methyl-2-pyrrolidone | 50 | Pyrazole | 0.1 | 47.7 |
| 1M | TMAH | 2 | 0.2 | Dimethyl sulfoxide | 50 | Pyrazole | 0.1 | 47.7 |
| 1N | TMAH | 5 | 0.2 | 1,3-Pirnethyl-2-imidazolidinone | 50 | Pyrazole | 0.1 | 44.7 |
| 1O | TMAH | 10 | 0.2 | Ethanol | 30 | Pyrazole | 0.1 | 59.7 |
| 1P | TMAH | 10 | 0.2 | 2-Propanol | 30 | Pyrazole | 0.1 | 59.7 |
| 1Q | TMAH | 10 | 0.2 | Ethylene glycol | 30 | Pyrazole | 0.1 | 59.7 |
| 1R | TMAH | 10 | 0.2 | Propylene glycol | 30 | Pyrazole | 0.1 | 59.7 |
| 1S | TMAH | 15 | 0.2 | Glycerine | 30 | Pyrazole | 0.1 | 54.7 |
| 1T | TMAH | 15 | 0.2 | Diethylene glycol | 30 | Pyrazole | 0.1 | 54.7 |
| 1U | TMAH | 15 | 0.2 | Xylitol | 30 | Pyrazole | 0.1 | 54.7 |
| 1V | TMAH | 15 | 0.2 | Sorbitol | 30 | Pyrazole | 0.1 | 54.7 |
| 1W | TMAH | 2 | 0.2 | Diethylene glycol monomethyl ether | 50 | Pyrazole | 0.1 | 47.7 |
| 1X | TMAH | 0.5 | 0.2 | Diethylene glycol monomethyl ether | 50 | Pyrazole | 0.1 | 49.2 |
| 1Y | TMAH | 10 | 0.005 | Diethylene glycol monomethyl ether | 50 | Pyrazole | 0.1 | 39.895 |
| 1Z | TMAH | 2 | 0.3 | Diethylene glycol monomethyl ether | 50 | Pyrazole | 0.1 | 47.6 |
| 1AA | TMAH | 5 | 0.2 | Diethylene glycol monomethyl ether | 10 | Pyrazole | 0.1 | 84.7 |
| 1AB | TMAH | 5 | 0.2 | Diethylene glycol monomethyl ether | 15 | Pyrazole | 0.1 | 79.7 |
| 1AC | TMAH | 2 | 0.2 | Diethylene glycol monomethyl ether | 70 | Pyrazole | 0.1 | 27.7 |
| 1AD | TMAH | 2 | 0.2 | Diethylene glycol monomethyl ether | 50 | Pyrazole | 0.001 | 47.799 |
| 1AE | TMAH | 2 | 0.2 | Diethylene glycol monomethyl ether | 50 | Pyrazole | 0.05 | 47.75 |
| 1AF | TMAH | 2 | 0.2 | Diethylene glycol monomethyl ether | 50 | Pyrazole | 7 | 40.8 |
| 1AG | TMAH | 2 | 0.2 | Diethylene glycol monomethyl ether | 50 | Pyrazole | 5 | 42.8 |
| 1AH | TMAH | 2 | 0.2 | Diethylene glycol monomethyl ether | 50 | 3,5-Dimethyl pyrazole | 0.1 | 47.7 |
| 1AI | TMAH | 2 | 0.2 | Diethylene glycol monomethyl ether | 50 | 3-Methyl-5-pyrazolone | 0.1 | 47.7 |
| 1AJ | TMAH | 2 | 0.2 | Diethylene glycol monomethyl ether | 50 | 3-Amino-5-hydroxypyrazole | 0.1 | 47.7 |

TMAH: tetramethylammonium hydroxide
TEAH: tetraethylammonium hydroxide
TPAH: tetrapropylammonium hydroxide
TBAH: tetrabutylammonium hydroxide

TABLE 2

| Examples | Cleaning liquid | Temperature °C. | Immersion time min | Removal result I | II | III | Damage IV | V | VI | VII |
|---|---|---|---|---|---|---|---|---|---|---|
| 1 | 1A | 50 | 20 | ○ | ○ | ○ | ⊚ | ⊚ | ⊚ | ○ |
| 2 | 1B | 50 | 3 | ○ | ○ | ○ | ⊚ | ⊚ | ⊚ | ○ |
| 3 | 1C | 50 | 5 | ○ | ○ | ○ | ⊚ | ⊚ | ⊚ | ○ |
| 4 | 1D | 50 | 5 | ○ | ○ | ○ | ⊚ | ⊚ | ⊚ | ○ |
| 5 | 1E | 50 | 5 | ○ | ○ | ○ | ⊚ | ⊚ | ⊚ | ○ |
| 6 | 1F | 50 | 5 | ○ | ○ | ○ | ⊚ | ⊚ | ⊚ | ○ |
| 7 | 1G | 50 | 5 | ○ | ○ | ○ | ⊚ | ⊚ | ⊚ | ○ |
| 8 | 1H | 50 | 3 | ○ | ○ | ○ | ⊚ | ⊚ | ⊚ | ○ |
| 9 | 1I | 50 | 3 | ○ | ○ | ○ | ⊚ | ⊚ | ⊚ | ○ |
| 10 | 1J | 50 | 3 | ○ | ○ | ○ | ⊚ | ⊚ | ⊚ | ○ |
| 11 | 1K | 50 | 3 | ○ | ○ | ○ | ⊚ | ⊚ | ⊚ | ○ |
| 12 | 1L | 50 | 3 | ○ | ○ | ○ | ⊚ | ⊚ | ⊚ | ○ |
| 13 | 1M | 50 | 3 | ○ | ○ | ○ | ⊚ | ⊚ | ⊚ | ○ |
| 14 | 1N | 50 | 3 | ○ | ○ | ○ | ⊚ | ⊚ | ⊚ | ○ |
| 15 | 1O | 50 | 3 | ○ | ○ | ○ | ⊚ | ⊚ | ⊚ | ○ |
| 16 | 1P | 50 | 3 | ○ | ○ | ○ | ⊚ | ⊚ | ⊚ | ○ |
| 17 | 1Q | 50 | 3 | ○ | ○ | ○ | ⊚ | ⊚ | ⊚ | ○ |
| 18 | 1R | 50 | 3 | ○ | ○ | ○ | ⊚ | ⊚ | ⊚ | ○ |
| 19 | 1S | 50 | 5 | ○ | ○ | ○ | ⊚ | ⊚ | ⊚ | ○ |
| 20 | 1T | 50 | 3 | ○ | ○ | ○ | ⊚ | ⊚ | ⊚ | ○ |
| 21 | 1U | 50 | 3 | ○ | ○ | ○ | ⊚ | ⊚ | ⊚ | ○ |
| 22 | 1V | 50 | 3 | ○ | ○ | ○ | ⊚ | ⊚ | ⊚ | ○ |
| 23 | 1W | 50 | 3 | ○ | ○ | ○ | ⊚ | ⊚ | ⊚ | ○ |
| 24 | 1X | 50 | 3 | ○ | ○ | ○ | ⊚ | ⊚ | ⊚ | ○ |
| 25 | 1Y | 50 | 20 | ○ | ○ | ○ | ○ | ⊚ | ⊚ | ○ |
| 26 | 1Z | 50 | 3 | ○ | ○ | ○ | ⊚ | ⊚ | ⊚ | ○ |
| 27 | 1AA | 50 | 10 | ○ | ○ | ○ | ○ | ⊚ | ⊚ | ○ |
| 28 | 1AB | 50 | 3 | ○ | ○ | ○ | ⊚ | ⊚ | ⊚ | ○ |
| 29 | 1AC | 50 | 3 | ○ | ○ | ○ | ⊚ | ⊚ | ⊚ | ○ |
| 30 | 1AD | 50 | 3 | ○ | ○ | ○ | ⊚ | ⊚ | ⊚ | ○ |
| 31 | 1AE | 50 | 3 | ○ | ○ | ○ | ⊚ | ⊚ | ⊚ | ○ |
| 32 | 1AF | 50 | 3 | ○ | ○ | ○ | ○ | ⊚ | ⊚ | ○ |
| 33 | 1AG | 50 | 3 | ○ | ○ | ○ | ⊚ | ⊚ | ⊚ | ○ |
| 34 | 1AH | 50 | 3 | ○ | ○ | ○ | ⊚ | ○ | ⊚ | ○ |
| 35 | 1AI | 50 | 3 | ○ | ○ | ○ | ⊚ | ⊚ | ⊚ | ○ |
| 36 | 1AJ | 50 | 3 | ○ | ○ | ○ | ⊚ | ⊚ | ⊚ | ○ |
| 37 | 1W | 20 | 20 | ○ | ○ | ○ | ⊚ | ⊚ | ⊚ | ○ |
| 38 | 1W | 25 | 10 | ○ | ○ | ○ | ⊚ | ⊚ | ⊚ | ○ |
| 39 | 1W | 80 | 0.3 | ○ | ○ | ○ | ⊚ | ⊚ | ⊚ | ○ |
| 40 | 1W | 70 | 0.5 | ○ | ○ | ○ | ⊚ | ⊚ | ⊚ | ○ |

Removal result I: Removal result for organosiloxane thin film 1
Removal result II: Removal result for dry etching residue 2
Removal result III: Removal result for photoresist 4
Damage IV: Damage to copper 5
Damage V: Damage to tungsten 8
Damage VI: Damage to low-k film 3
Damage VII: Damage to hard mask 9

TABLE 3

| Cleaning liquid | Composition of cleaning liquid (concentration in % by weight) |
|---|---|
| 3A | TMAH 10%, potassium hydroxide 0.02%, N-methyl-2-pyrrolidone 47.48%, thioglycerol 1.5%, IRGAMET42 1.0%, and water 40% |
| 3B | TMAH 10%, potassium hydroxide 0.02%, diethylene glycol monoethyl ether 40%, 2-ethyl-4-methylimidazole 2%, and water 47.98% |
| 3C | TMAH 1.0%, hydroxyamine 1.0%, ethylene diamine 3%, pyrazole 0.1%, and water 94.9% |
| 3D | TMAH 18%, hydrogen peroxide 3%, pyrazole 5%, and water 74% |
| 3E | TMAH 2%, pyrazole 30%, diethylene glycol monobutyl ether 60%, and water 8% |
| 3F | nitric acid 26%, sodium chlorate 3%, ferrous chloride 1.5%, pyrazole 1.0%, and water 68.5% |
| 3G | nitric acid 0.1%, sulfuric acid 4%, ammonium fluoride 0.06%, pyrazole 15%, and water 80.84% |
| 3H | mandelic acid 2.5%, pyrazole 0.1%, and water 97.4% |
| 3I | potassium hydroxide 0.2%, diethylene glycol monomethyl ether 50%, pyrazole 0.1%, and water 49.7% |
| 3J | TMAH 2%, diethylene glycol monomethyl ether 50%, pyrazole 0.1%, and water 47.9% |
| 3K | TMAH 2%, potassium hydroxide 0.2%, pyrazole 0.1%, and water 97.7% |
| 3L | TMAH 2%, potassium hydroxide 0.2%, diethylene glycol monomethyl ether 50%, and water 47.8% |
| 3M | TMAH 2%, potassium hydroxide 0.2%, diethylene glycol monomethyl ether 50%, 1-methyl-1H-benzotriazole 0.1%, and water 47.7% |
| 3N | TMAH 2%, potassium hydroxide 0.2%, diethylene glycol monomethyl ether 50%, benzotriazole 0.2%, tolyltriazole 0.2%, ethanol 1%, and water 46.4% |
| 3O | TMAH 2%, potassium hydroxide 0.2%, diethylene glycol monomethyl ether 50%, ethanolamine 5%, and water 42.8% |
| 3P | TMAH 2%, potassium hydroxide 0.2%, diethylene glycol monomethyl ether 50%, benzotriazole 1%, and water 46.8% |
| 3Q | TMAH 2%, potassium hydroxide 0.2%, diethylene glycol monomethyl ether 50%, 5-aminotetrazole 0.5%, and water 47.3% |
| 3R | TMAH 2%, potassium hydroxide 0.2%, diethylene glycol monomethyl ether 50%, pyridine 3%, and water 44.8% |
| 3S | TMAH 2%, potassium hydroxide 0.2%, diethylene glycol monomethyl ether 50%, 1-vinyl imidazole 0.8%, and water 47% |
| 3T | TMAH 2%, potassium hydroxide 0.2%, diethylene glycol monomethyl ether 50%, imidazole 0.02%, and water 47.78% |

TABLE 4

| Comparative Example | Cleaning liquid | Temperature °C. | Immersion time min | Removal result I | II | III | Damage IV | V | VI | VII |
|---|---|---|---|---|---|---|---|---|---|---|
| 1 | 3A | 60 | 1 | X | ○ | ○ | X | X | ◎ | ○ |
| 2 | 3B | 50 | 10 | X | ○ | ○ | X | ◎ | ◎ | X |
| 3 | 3C | 40 | 40 | X | ○ | ○ | X | X | ◎ | ○ |
| 4 | 3D | 25 | 10 | X | X | ○ | X | X | ◎ | X |
| 5 | 3E | 70 | 30 | X | ○ | ○ | X | X | ◎ | X |
| 6 | 3F | 35 | 10 | X | ○ | X | X | X | ◎ | X |
| 7 | 3G | 30 | 2 | X | ○ | X | X |   | ◎ | X |
| 8 | 3H | 25 | 10 | X | ○ | X | X | ◎ | ◎ | ○ |
| 9 | 3I | 50 | 3 | X | X | X | X | X | ◎ | ○ |
| 10 | 3J | 50 | 30 | X | ○ | ○ | ◎ | ◎ | ◎ | ○ |
| 11 | 3K | 50 | 3 | X | X | ○ | X | ◎ | ◎ | ○ |
| 12 | 3L | 50 | 1 | X | ○ | ○ | X | ◎ | ◎ | ○ |
| 13 | 3M | 50 | 1 | X | ○ | ○ | X | ◎ | ◎ | ○ |
| 14 | 3N | 50 | 3 | X | ○ | ○ | X | ◎ | ◎ | ○ |
| 15 | 3O | 50 | 1 | X | ○ | ○ | X | X | ◎ | ○ |
| 16 | 3P | 50 | 1 | X | ○ | ○ | X | ◎ | ◎ | ○ |
| 17 | 3Q | 50 | 1 | X | ○ | ○ | X | ◎ | ◎ | ○ |
| 18 | 3R | 50 | 1 | X | ○ | ○ | X | ◎ | ◎ | ○ |
| 19 | 3S | 50 | 3 | X | X | ○ | X | ◎ | ◎ | ○ |
| 20 | 3T | 50 | 1 | X | ○ | ○ | X | ◎ | ◎ | ○ |

Removal result I: Removal result for organosiloxane thin film 1
Removal result II: Removal result for dry etching residue 2
Removal result III: Removal result for photoresist 4
Damage IV: Damage to copper 5
Damage V: Damage to tungsten 8
Damage VI: Damage to low-k film 3
Damage VII: Damage to hard mask 9

INDUSTRIAL APPLICABILITY

By using a cleaning liquid and a cleaning method according to the present invention it becomes possible to suppress damages to a low-k film, copper or a copper alloy, a barrier metal, and a barrier dielectric film, and to remove an organosiloxane thin film, a dry etching residue, and photoresist on a treatment target surface in a production process for a semiconductor device, so that a high precision and high quality semiconductor device can be produced at a high yield, which is industrially advantageous.

REFERENCE SIGNS LIST

1: Organosiloxane thin film
2: Dry etching residue
3: Low-k film (low-dielectric constant interlayer dielectric film)
4: Photoresist
5: Copper (copper wiring and/or copper alloy wiring)
6: Barrier metal
7: Barrier dielectric film
8: Tungsten
9: Hard mask

The invention claimed is:

1. A cleaning liquid composition, consisting essentially of:
   0.1 to 20% by weight of at least one quaternary ammonium hydroxide selected from the group consisting of tetramethylammonium hydroxide, tetraethylammonium hydroxide, tetrapropylammonium hydroxide, tetrabutylammonium hydroxide, and choline,
   0.005 to 0.3% by weight of potassium hydroxide,
   10 to 80% by weight of at least one water-soluble organic solvent selected from the group consisting of alcohols selected from ethanol, 2-propanol, ethylene glycol, propylene glycol, glycerine, diethylene glycol, xylitol, and sorbitol; glycol ethers selected from diethylene glycol monomethyl ether, diethylene glycol monoethyl ether, diethylene glycol monobutyl ether, diethylene glycol dimethyl ether, and dipropylene glycol monomethyl ether; amides selected from N,N-dimethyl acetamide, and N-methyl-2-pyrrolidone; dimethyl sulfoxide; and 1,3-dimethyl-2-imidazolidinone,
   0.001 to 7% by weight of at least one pyrazole selected from the group consisting of pyrazole, 3,5-dimethyl pyrazole, 3-methyl-5-pyrazolone, and 3-amino-5-hydroxypyrazole, and
   water.

2. The cleaning liquid composition according to claim 1, wherein the composition does not contain azoles other than the pyrazoles.

3. The cleaning liquid composition according to claim 1, wherein said water is present in an amount of from 19.3 to 84.7% by weight.

4. A production process for a semiconductor device comprising:
   layering in the order from bottom to top an organosiloxane film, and a photoresist on to a substrate provided with a low-dielectric constant interlayer dielectric film, and a copper wiring and/or a copper alloy wiring,
   forming a photoresist pattern by conducting a selective exposure and development treatment on the photoresist,
   conducting a dry etching treatment on the organosiloxane film, and the low-dielectric constant interlayer dielectric film using photoresist pattern as a mask, and
   removing the organosiloxane film, a dry etching residue, and the photoresist using a cleaning liquid composition according to claim 1.

5. The production process for a semiconductor device according to claim 4, wherein the copper wiring and/or the copper alloy wiring has a wiring width of 100 nm or less.

6. A production process for a semiconductor device comprising:
   layering in the order from bottom to top a hard mask, an organosiloxane film, and a photoresist on to a substrate provided with a low-dielectric constant interlayer dielectric film, and a copper wiring and/or a copper alloy wiring,
   forming a photoresist pattern by conducting a selective exposure and development treatment on the photoresist,
   conducting a dry etching treatment on the hard mask, the organosiloxane film, and the low-dielectric constant interlayer dielectric film using the photoresist pattern as a mask, and
   removing the organosiloxane film, a dry etching residue, and the photoresist using a cleaning liquid composition according to claim 1.

* * * * *